(12) United States Patent
Coyle et al.

(10) Patent No.: US 7,372,195 B2
(45) Date of Patent: May 13, 2008

(54) ELECTRON BEAM SOURCE HAVING AN EXTRACTION ELECTRODE PROVIDED WITH A MAGNETIC DISK ELEMENT

(75) Inventors: Steven T. Coyle, Alameda, CA (US); Michael R. Scheinfein, Portland, OR (US); William J. Devore, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/286,802

(22) Filed: Nov. 22, 2005

(65) Prior Publication Data

US 2007/0057617 A1    Mar. 15, 2007

Related U.S. Application Data

(60) Provisional application No. 60/715,973, filed on Sep. 10, 2005.

(51) Int. Cl.
*H01J 27/02* (2006.01)
*H01J 27/26* (2006.01)

(52) U.S. Cl. ............... 313/363.1; 313/362.1; 250/396 R; 250/492.3

(58) Field of Classification Search ............... 313/446, 313/153, 441, 364, 155, 158, 359.1, 361.1, 313/363.1; 315/111.81; 250/396 R, 492.3
See application file for complete search history.

(56) References Cited

U.S. PATENT DOCUMENTS

| | | | | |
|---|---|---|---|---|
| 2,834,901 A | * | 5/1958 | Barkow et al. ............. 313/413 |
| 3,336,491 A | * | 8/1967 | Mercer et al. .............. 313/148 |
| 3,802,935 A | * | 4/1974 | Martin et al. .............. 148/103 |
| 3,967,115 A | * | 6/1976 | Kern ........................ 250/251 |
| 4,360,007 A | * | 11/1982 | Levy et al. ................. 128/899 |
| 4,670,726 A | * | 6/1987 | Ogata et al. ............... 335/212 |
| 4,942,322 A | * | 7/1990 | Raybould et al. ......... 310/156.11 |
| 5,041,732 A | * | 8/1991 | Saito et al. ............ 250/396 ML |
| 5,070,282 A | * | 12/1991 | Epsztein ..................... 315/383 |
| 5,122,663 A | * | 6/1992 | Chang et al. ............... 250/310 |
| 5,155,412 A |  | 10/1992 | Chang et al. |
| 5,227,753 A | * | 7/1993 | Hirai et al. ................ 335/212 |
| 5,449,968 A |  | 9/1995 | Terui et al. |
| 5,604,401 A |  | 2/1997 | Makishima |
| 5,708,327 A |  | 1/1998 | O'Boyle |
| 5,962,961 A |  | 10/1999 | Sakai et al. |
| 6,008,577 A | * | 12/1999 | Rasmussen et al. ......... 313/496 |

(Continued)

OTHER PUBLICATIONS

Delong, et al. "Field emission gun for microengineering application," J. Phys. E. Sci. Instrum. 22 (1989) pp. 612-614.

(Continued)

*Primary Examiner*—Mariceli Santiago
(74) *Attorney, Agent, or Firm*—Patterson & Sheridan LLP

(57) ABSTRACT

An electron beam source for use in an electron gun. The electron beam source includes an emitter terminating in a tip. The emitter is configured to generate an electron beam. The electron beam source further includes a suppressor electrode laterally surrounding the emitter such that the tip of the emitter protrudes through the suppressor electrode and an extractor electrode disposed adjacent the tip of the emitter. The extractor electrode comprises a magnetic disk whose magnetic field is aligned with an axis of the electron beam.

22 Claims, 4 Drawing Sheets

U.S. PATENT DOCUMENTS

| | | | |
|---|---|---|---|
| 6,061,265 A * | 5/2000 | Hannah | 365/121 |
| 6,392,333 B1 * | 5/2002 | Veneklasen et al. | 313/361.1 |
| 2002/0195944 A1 * | 12/2002 | Murakami | 315/14 |
| 2004/0195973 A1 * | 10/2004 | Horsky | 315/111.81 |
| 2004/0217304 A1 * | 11/2004 | Veneklasen et al. | 250/492.2 |

OTHER PUBLICATIONS

Veneklasen, et al. "A field-emission illumination system using a new optical configuration," J. Appl. Phys., vol. 43, No. 12, Dec. 1972, pp. 4989-4996.

* cited by examiner

ELECTRON BEAM SOURCE HAVING AN EXTRACTION ELECTRODE PROVIDED WITH A MAGNETIC DISK ELEMENT

CROSS-REFERENCE TO RELATED APPLICATIONS

This application claims benefit of U.S. provisional patent application Ser. No. 60/715,973, filed Sep. 10, 2005, which is herein incorporated by reference in its entirety.

BACKGROUND OF THE INVENTION

1. Field of the Invention

Embodiments of the present invention generally relate to electron guns (sources), and more particularly, electron guns that may be used, for instance, in electron beam lithography or electron microscopy.

2. Description of the Related Art

Electron beam columns are well known for use, for instance, in electron beam lithography for imaging a pattern onto a substrate typically coated with a resist sensitive to electron beams. Subsequent development of the exposed resist defines a pattern in the resist which later can be used as a pattern for etching or other processes. Electron beam columns are also used in electron microscopy for imaging surfaces and thin samples. Conventional electron beam columns for electron microscopy and lithography are well known and typically include an electron gun having an electron emitter for producing an electron beam. The beam from the gun may be used to produce a scanning probe or illuminate a sample or an aperture using a series of electron beam lenses, which may be magnetic or electrostatic.

Electron beam columns generally include a source of electrons, such as a Schottky emission gun or a field emission gun, which typically includes an emitter (cathode), an electrostatic pre-accelerator lens that focuses the electron beam and a series of lenses that refocuses and images the source aperture or sample onto the target.

It has generally been difficult to obtain very high beam currents focused into a small spot using Schottky electron sources. Although the brightness of the emitter is high in such sources, the angular intensity of the electron beam emerging from the emitter region is limited by the properties of the emitter itself. Consequently, a rather large aperture angle must be used in the electron gun, which makes spherical and chromatic aberration in the gun lens a major factor in limiting the small spot size that can be achieved, which is generally referred to as the smallest cross-section diameter of the beam.

One approach to reduce aberrations in the gun lens is to use a magnetic lens as the focus element. Using this approach, the emitter tip and the extraction region are immersed in a magnetic field, which results in a significant increase in the operating solid angle of emission compared to all-electrostatic systems. However, one disadvantage of this design is that the lens coil and its cooling fluid may float at near the tip potential, which requires a more complicated high voltage power supply and cable. Further, the mechanical design is a large departure from conventional Schottky or field emission designs, which adds further complication to the approach.

Other attempts to reduce aberrations in the gun lens have been made. However, those attempts have proven to be difficult since the size and focal length of standard electrostatic lenses are limited by the large stand-off distance required in high voltage systems.

Therefore, a need exists in the art for a new electron beam source for an electron gun with minimal aberrations.

SUMMARY OF THE INVENTION

Various embodiments of the invention are generally directed to an electron beam source for use in an electron gun. The electron beam source includes an emitter terminating in a tip. The emitter is configured to generate an electron beam. The electron beam source further includes a suppressor electrode laterally surrounding the emitter such that the tip of the emitter protrudes through the suppressor electrode and an extractor electrode disposed adjacent the tip of the emitter. The extractor electrode comprises a magnetic disk whose magnetic field is aligned with an axis of the electron beam.

Various embodiments of the invention are also generally directed to an electron beam source for use in an electron gun. The electron beam source includes an emitter terminating in a tip. The emitter is configured to generate an electron beam. The electron beam source further includes a suppressor electrode laterally surrounding the emitter such that the tip of the emitter protrudes through the suppressor electrode and an extractor electrode disposed adjacent the tip of the emitter. The extractor electrode comprises an extraction support and a magnetic disk disposed on the extraction support. The magnetic disk is a permanent magnet.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
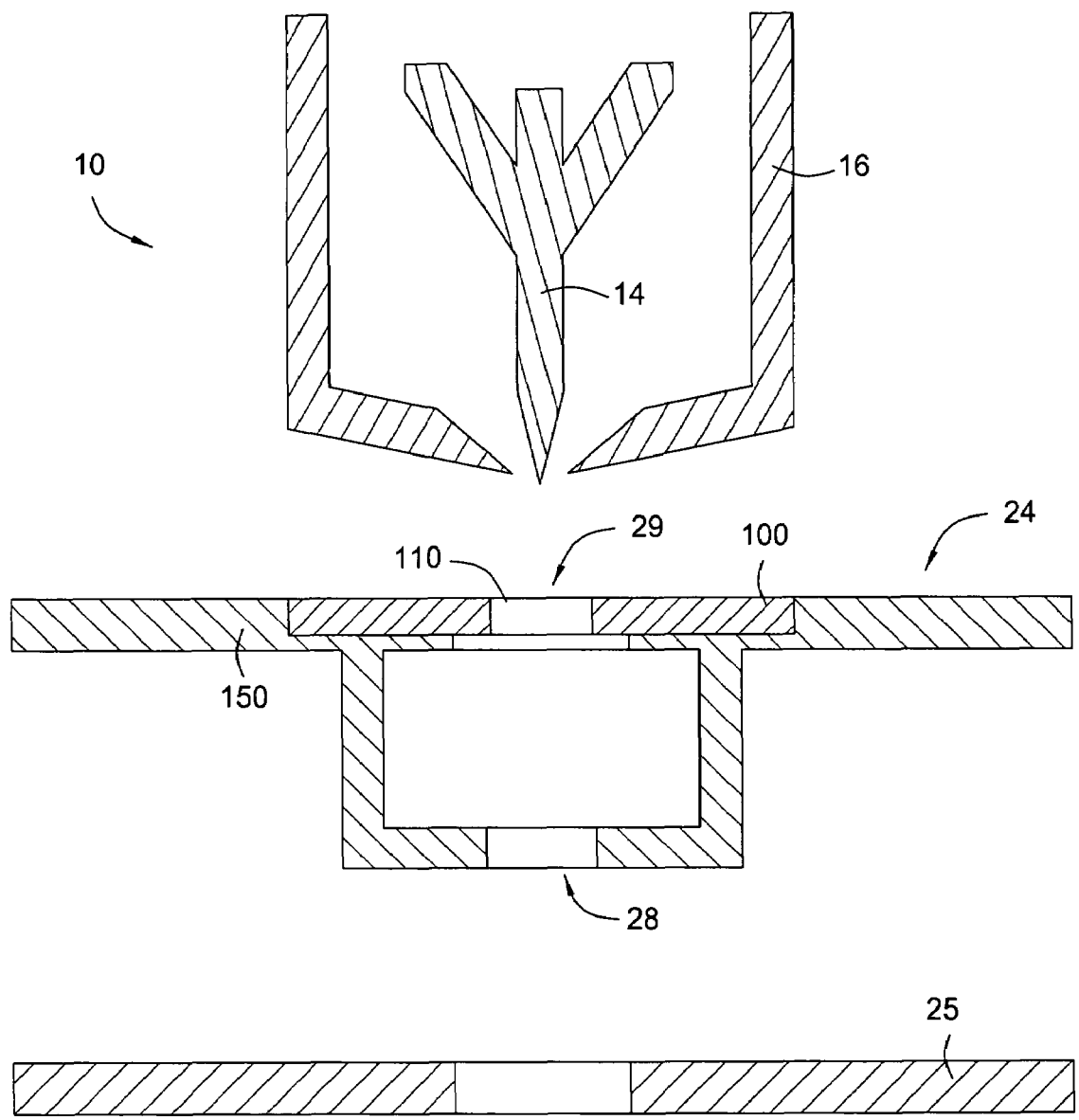
FIG. 1 illustrates a side cross sectional view of a portion of an electron gun in accordance with one or more embodiments of the invention.

FIG. 1 illustrates a side cross sectional view of a portion of an electron gun 10 in accordance with one or more embodiments of the invention. The remainder of the electron gun 10 is not shown. The electron gun 10 may be a field emission or Schottky emission gun. Details of such a device are described in L. Swanson and G. Schwind, "A Review of The ZrO/W Schottky Cathode", Handbook of Charged Particle Optics editor Jon Orloff, CRC Press LLC, New York, (1997), which is incorporated herein by reference. The electron gun 10 includes an emitter (cathode) 14, which is configured to generate an electron beam. The emitter 14 may be an oriented single crystal tungsten structure with a sharp point (approximately 1 micrometer radius) and mounted on a hair pin filament (not shown). The emitter 14 may be surrounded by a negatively biased suppressor electrode 16, which may be a conductive structure that prevents thermionically emitted electrons from leaving the emitter 14 anywhere but near its tip. The pointed tip of the emitter 14 protrudes slightly from the suppressor electrode 16 and faces an extractor electrode 24, which defines an upper aperture 29. The extractor electrode 24 may be biased positively with respect to the emitter 14 and defines a lower aperture 28 below the upper aperture 29 to shape the electron beam entering the downstream gun lens (not shown).

In accordance with one embodiment of the invention, the extractor electrode 24 includes a magnetic disk 100 disposed on an extraction support 150, which may be made from a non magnetic material. The magnetic disk 100 may be a permanent magnet made from materials such as samarium cobalt, neodymium iron boron and the like. The magnetic disk 100 is ring shaped (toroidal) having an opening 110 for allowing the electron beam to pass therethrough. In one embodiment, the top surface of the magnetic disk 100 is about 1 mm apart from the tip of the emitter 14. The magnet disk 100 is disposed such that the axis of the opening 110 is aligned with the beam axis. In this manner, the magnetic disk 100 acts as a fixed focal length lens. The magnetic disk 100 may be encased in a stainless steel sheath for increasing structural rigidity or reducing contamination, e.g., outgassing or particulates. The electron gun 10 may further include a focus electrode 25, such as an electrostatic lens, to further focus the electron beam coming out of the extractor electrode 24. In this manner, the magnetic disk 100 has a fixed focal length, while the focus electrode 25 has a variable focal length (by varying the voltage).

Figure 2:
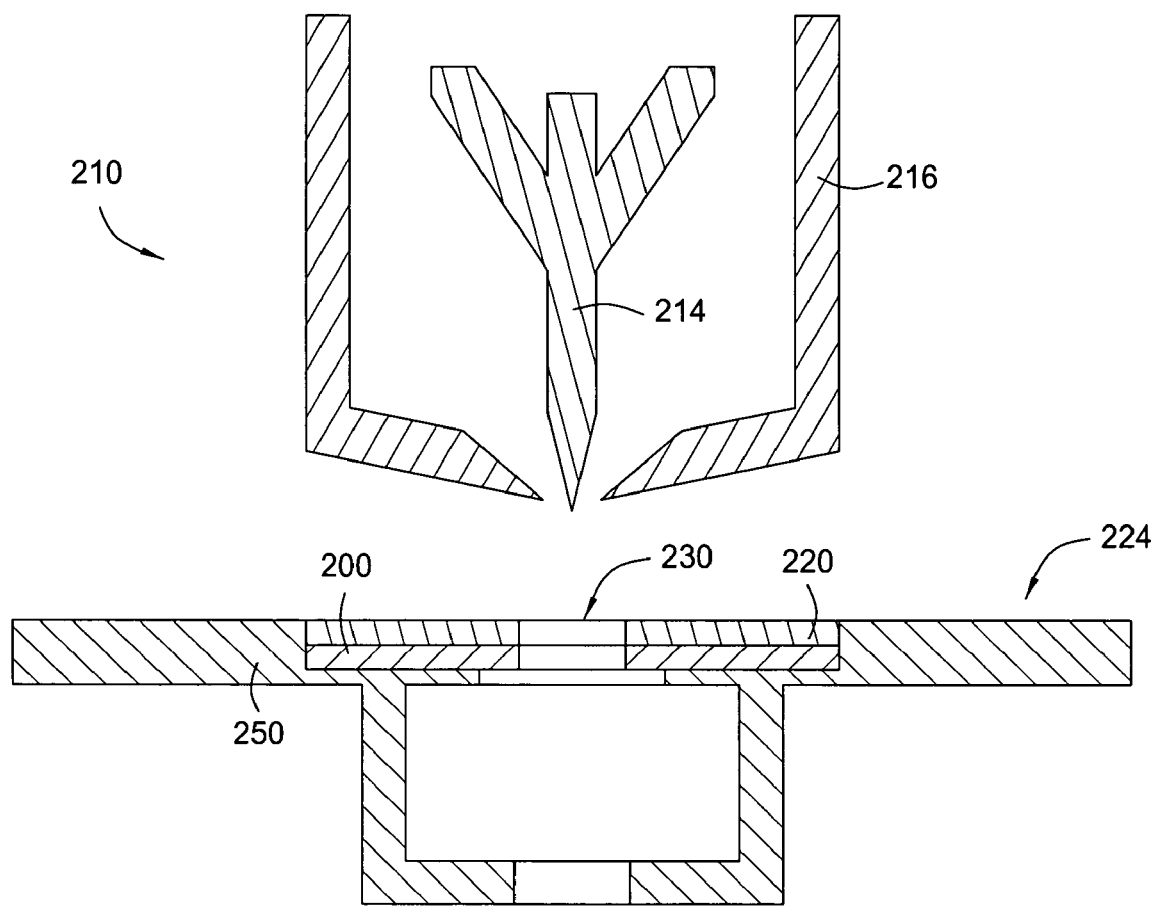
FIG. 2 illustrates a side cross sectional view of a portion of an electron gun in accordance with another embodiment of the invention.

FIG. 2 illustrates a side cross sectional view of a portion of an electron gun 210 in accordance with another embodiment of the invention. The electron gun 210 has an extractor electrode 224, which includes an extraction aperture disk 220 disposed on a magnetic disk 200, both of which are supported by an extraction support 250. The extraction aperture disk 220 is configured to protect the magnetic disk 200 from being bombarded by the electron beam. The extraction aperture disk 220 may be made from non magnetic material, such as molybdenum, stainless steel, titanium and the like. The magnetic disk 200 may be a permanent magnet made from materials such as samarium cobalt, neodymium iron boron, and the like. The magnetic disk 200 is ring shaped (toroidal) having an opening 230 for allowing the electron beam to pass therethrough. The rest of the components of the electron gun 210, e.g., an emitter 214 and a suppressor electrode 216, are substantially the same as the components of the electron gun 10. Accordingly, other details of various components of the electron gun 210 are provided with reference to the electron gun 10 described above.

Figure 3:
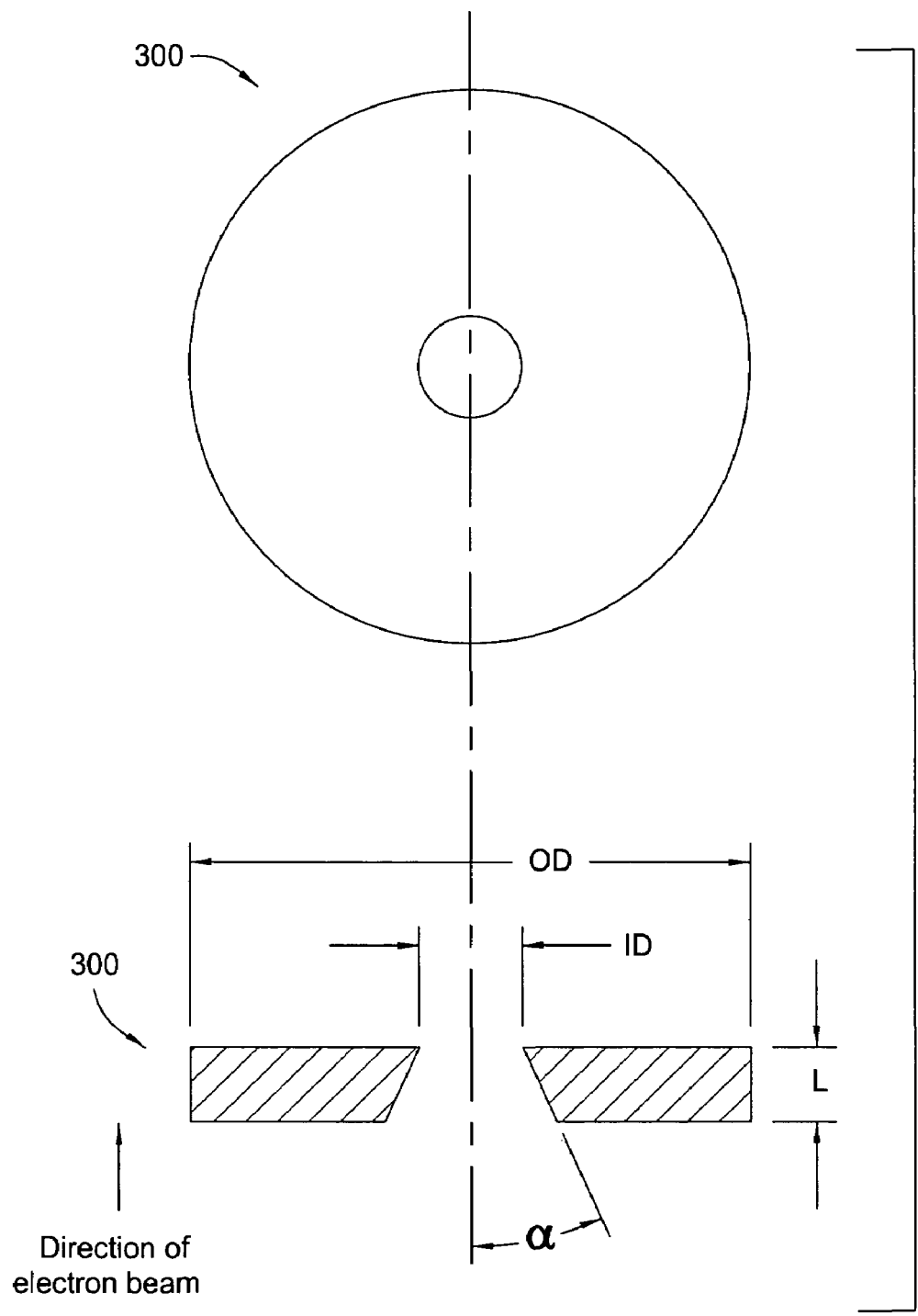
FIG. 3 illustrates a top view and a cross sectional view of a magnetic disk in accordance with one or more embodiments of the invention.

FIG. 3 illustrates a top view and a cross sectional view of a magnetic disk 300 in accordance with one or more embodiments of the invention. In one embodiment, the magnetic disk 300 has an inner diameter (ID) of about 1 mm, an outer diameter (OD) of about 5 mm, a thickness (L) of about 1.025 mm, a taper bore angle ($\alpha$) of about 0 degrees, and a saturation magnetization ($M_S$) of about 875 emu/cm$^3$, which has been selected to match samarium cobalt type 32 HS. With such geometry, the magnetic disk 300 may be used to reduce the spherical aberration coefficient from about 19.8 mm (without magnetic disk) to about 2.9 mm (with magnetic disk). In this manner, embodiments of the invention may be used to reduce the spherical aberration coefficient of a conventional 50 kV electron gun by a factor of about 6. The spherical aberration coefficient may be further reduced to less than about 2.5 mm by increasing the OD to about 10 mm and decreasing the ID to about 0.5 mm. The spherical aberration coefficient may also be reduced by moving the magnetic disk closer to the emitter 14. In addition, the magnetic field of the magnetic disk may collimate the electron beam, thereby increasing the effective angular intensity of the beam current.

In one embodiment, the magnetic field of the magnetic disk 100, 200, 300 is aligned with the beam axis. The magnetic field may be calculated everywhere in space, using a charge density method, such as one described in "Field Computation By Moment Methods" by Roger F. Harrington, Wiley-IEEE Press (1993). The magnetic field along the beam axis (axial flux density) may then be extracted to a file, which may be used as an input to an electron optical simulation program ABER by Munro's Electron Beam Software Ltd., headquartered in London, England. The optical properties and aberrations of the lenses are then computed. Such aberrations include spherical aberration, chromatic aberration, distortion, astigmatism, coma, and field curvature. The geometric parameters, i.e., ID, OD, L and $\alpha$, of the magnetic disk as well as the location of the magnet disk may be varied to affect the optical properties and aberrations.

Figure 4:
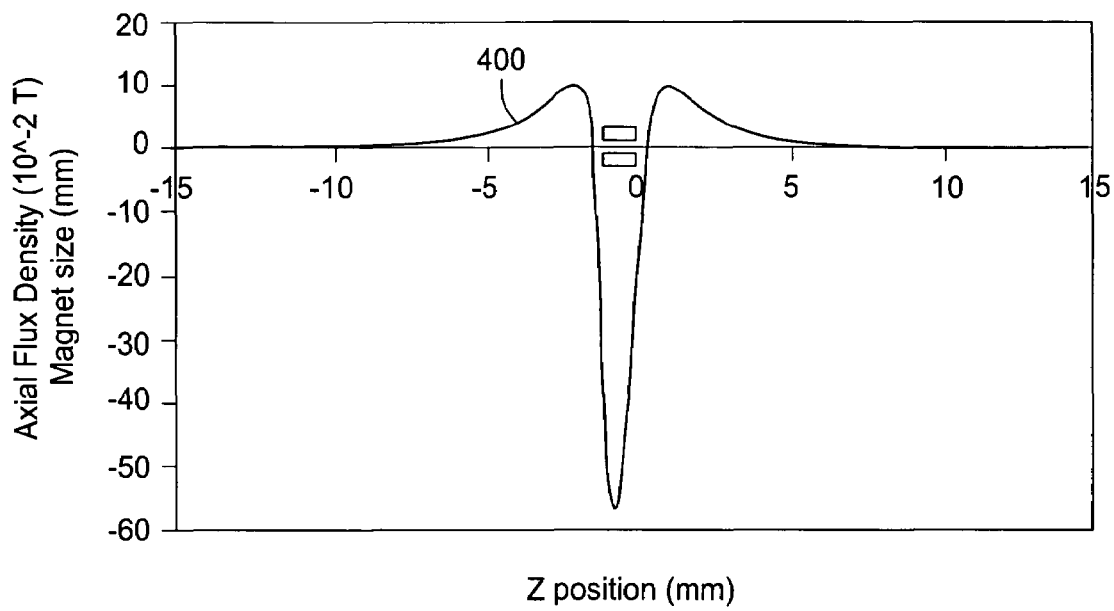
FIG. 4 illustrates a plot of the magnetic field for the magnetic disk along the beam axis (axial flux density) in accordance with one or more embodiments of the invention.

FIG. 4 illustrates a plot of the magnetic field for the magnetic disk along the beam axis (axial flux density) 400 in accordance with one or more embodiments of the invention. Notably, the axial flux density 400 is greatest at or substantially near the location of the magnetic disk.

Figure 5:
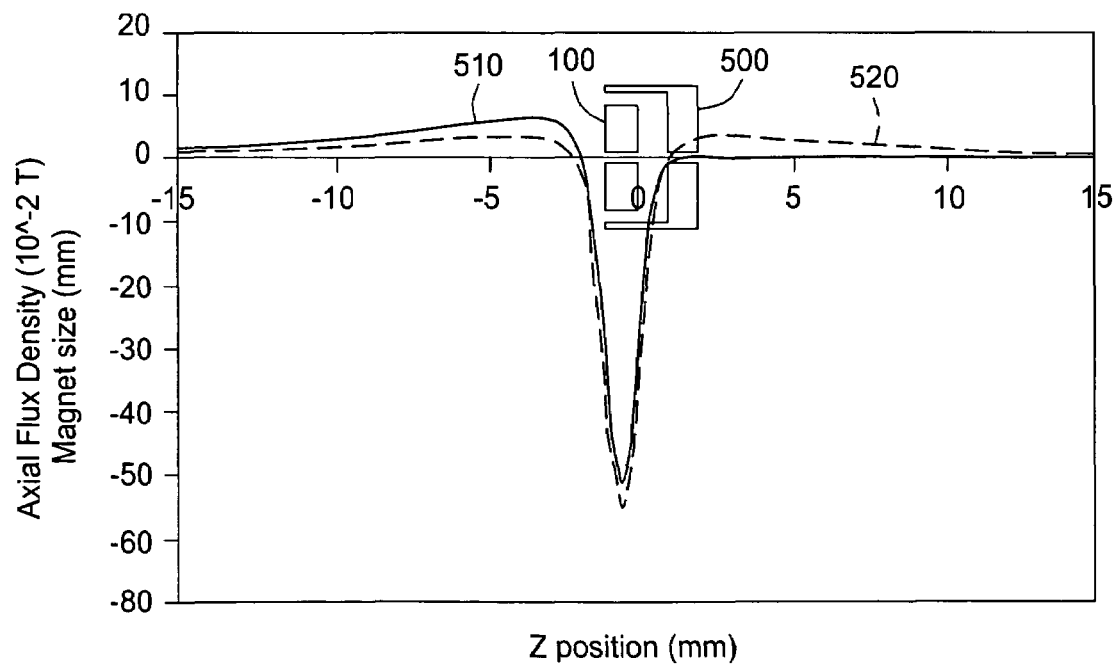
FIG. 5 illustrates the effect of a shunt on the axial flux density between the magnetic disk and the focus electrode in accordance with one or more embodiments of the invention.

It has been assumed that the axial flux density between the magnetic disk 100 and the focus electrode 25 would increase aberrations. Accordingly, a high permeability shunt may be added to the electron gun to reduce the axial flux density between the magnetic disk 100 and the focus electrode 25. The shunt may be disposed as part of the extraction support 150 or the suppressor electrode 16. FIG. 5 illustrates the effect of a shunt 500 on the axial flux density between the magnetic disk 100 and the focus electrode 25. The solid line represents the axial flux density 510 for the electron gun with the shunt 500, while the dotted line represents the axial flux density 520 for the electron gun without the shunt 500. Notably, axial flux density 510 between the magnetic disk 100 and the focus electrode 25 is significantly reduced to substantially zero. However, the spherical aberration coefficient may be higher for the electron gun with a shunt than for the electron gun without a shunt. On the other hand, placing a shunt as part of the suppressor electrode 16 may cause the axial flux density to extend farther into the extraction region, which may reduce aberrations.

In addition to adding a shunt to the electron gun, the thickness (L) of the magnetic disk may be reduced to reduce the magnitude of the axial flux density between the magnetic disk 100 and the focus electrode 25. Further, the magnetic disk 100 may be disposed closer to the emitter 14 to reduce the spherical aberration coefficient.

While the foregoing is directed to embodiments of the present invention, other and further embodiments of the invention may be devised without departing from the basic scope thereof, and the scope thereof is determined by the claims that follow.

What is claimed is:

1. An electron beam source for use in an electron gun, comprising:

an emitter terminating in a tip, wherein the emitter is configured to generate an electron beam;

a suppressor electrode laterally surrounding the emitter such that the tip of the emitter protrudes through the suppressor electrode; and an extractor electrode disposed adjacent the tip of the emitter, wherein the extractor electrode defines a lower aperture having an axis aligned with an axis of the electron beam axis and comprises a magnetic disk, that defines an upper aperture above the lower aperture, wherein the magnetic disk has a magnetic field that is aligned with the axis of the electron beam.

2. The electron beam source of claim 1, wherein the magnetic disk is a permanent magnet.

3. The electron beam source of claim 1, wherein the magnetic disk is made from samarium cobalt.

4. The electron beam source of claim 1, wherein the magnetic disk is toroidal in shape.

5. The electron beam source of claim 1, wherein the electron gun is one of a field emission gun and a Schottky emission gun.

6. The electron beam source of claim 1, wherein the magnetic disk is encased in a stainless steel sheath.

7. The electron beam source of claim 6, wherein the stainless steel sheath is configured to protect the magnetic disk from being bombarded by the electron beam.

8. The electron beam source of claim 1, wherein the magnetic disk is disposed 1 mm or less from the tip of the emitter.

9. The electron beam source of claim 1, further comprising a focus electrode disposed adjacent the extractor electrode, wherein the focus electrode is configured to further focus the electron beam coming out of the extractor electrode.

10. The electron beam source of claim 1, wherein the extractor electrode further comprises an extraction aperture disk disposed in front of the magnetic disk.

11. The electron beam source of claim 10, wherein the extraction aperture disk is configured to protect the magnetic disk from being bombarded by the electron beam.

12. The electron beam source of claim 1, wherein the magnetic disk has an inner diameter of 1 mm.

13. The electron beam source of claim 1, wherein the magnetic disk has an outer diameter of 5 mm.

14. The electron beam source of claim 1, wherein the magnetic disk has thickness of 1.025 mm.

15. The electron beam source of claim 1, wherein the magnetic disk has a taper bore angle of 0 degrees.

16. The electron beam source of claim 1, wherein the magnetic disk has a saturation magnetization of 875 emu/$cm^3$.

17. The electron beam source of claim 1, wherein the extractor electrode comprises an extraction support for supporting the magnetic disk and a high permeability shunt disposed as part of the extraction support.

18. The electron beam source of claim 17, further comprising a focus electrode disposed adjacent the extractor electrode, wherein the high permeability shunt is configured to reduce the magnetic field between the magnetic disk and the focus electrode.

19. The electron beam source of claim 1, wherein the extractor electrode comprises an extraction support for supporting the magnetic disk; and a high permeability shunt disposed as part of the suppressor electrode.

20. An electron beam source for use in an electron gun, comprising:

an emitter terminating in a tip, wherein the emitter is configured to generate an electron beam;

a suppressor electrode laterally surrounding the emitter such that the tip of the emitter protrudes through the suppressor electrode; and an extractor electrode disposed adjacent the tip of the emitter, wherein the extractor electrode comprises an extraction support defining a lower aperture and a magnetic disk disposed on the extraction support, wherein the magnetic disk is a permanent magnet defining an upper aperture above the lower aperture.

21. The electron beam source of claim 20, wherein the magnetic disk is made from samarium cobalt.

22. The electron beam source of claim 20, further comprising a focus electrode disposed adjacent the extractor electrode, wherein the extraction support comprises a high permeability shunt configured to reduce the magnetic field between the magnetic disk and the focus electrode.

* * * * *

UNITED STATES PATENT AND TRADEMARK OFFICE
CERTIFICATE OF CORRECTION

PATENT NO. : 7,372,195 B2  Page 1 of 1
APPLICATION NO. : 11/286802
DATED : May 13, 2008
INVENTOR(S) : Coyle et al.

It is certified that error appears in the above-identified patent and that said Letters Patent is hereby corrected as shown below:

In the Claims:

Column 5, Claim 1, Line 9, please delete "axis".

Signed and Sealed this

Sixteenth Day of December, 2008

JON W. DUDAS
*Director of the United States Patent and Trademark Office*